United States Patent [19]

Fujikawa et al.

[11] Patent Number: 4,464,456

[45] Date of Patent: Aug. 7, 1984

[54] PHOTOSENSITIVE POLYMER COMPOSITIONS COMPRISING POLYETHER-ESTER AMIDES

[75] Inventors: Junichi Fujikawa, Kyoto; Hiroshi Mataki, Otsu; Chiaki Tanaka, Chita; Shinobu Nakashima, Nagoya, all of Japan

[73] Assignee: Toray Industries, Inc., Tokyo, Japan

[21] Appl. No.: 455,308

[22] Filed: Jan. 3, 1983

[30] Foreign Application Priority Data

Jan. 6, 1982 [JP] Japan ..................................... 57-669

[51] Int. Cl.$^3$ .............................................. G03C 1/68
[52] U.S. Cl. ..................................... 430/281; 430/283; 430/288; 430/286; 430/906; 204/159.19
[58] Field of Search ............... 430/906, 281, 288, 286, 430/283; 204/159.19, 159.15

[56] References Cited

U.S. PATENT DOCUMENTS

| | | | |
|---|---|---|---|
| 4,230,838 | 10/1980 | Foy et al. | 525/408 |
| 4,309,518 | 1/1982 | Horlbeck et al. | 525/408 X |
| 4,323,639 | 4/1982 | Chiba et al. | 430/281 |
| 4,349,661 | 9/1982 | Mumcu | 525/419 X |

FOREIGN PATENT DOCUMENTS

WO80/01212 6/1980 PCT Int'l Appl. .

*Primary Examiner*—John E. Kittle
*Assistant Examiner*—Cynthia Hamilton
*Attorney, Agent, or Firm*—Austin R. Miller

[57] ABSTRACT

A photosensitive polymer composition containing 0.01% to 10% by weight of a photosensitizer and, the following components A and B, is presented.

A. 100 parts by weight of polyether-ester amide comprising (a) at least one compound selected from the group consisting of aminocarboxylic acids having 6 to 15 carbon atoms, lactams having 6 to 15 carbon atoms and nylon mn salts wherein $10 \leq m+n \leq 30$, (b) at least one poly(alkylene oxide) glycol having a number average molecular weight of 200 to 6000, and (c) at least one dicarboxylic acid having 4 to 20 carbon atoms; and B. 10 to 200 parts by weight of at least one photopolymerizable vinyl monomer having a terminal ethylenically unsaturated bond and having a boiling point of at least 150° C.

This photosensitive polymer composition is extremely effective for use in a photosensitive flexographic printing plate developable in water or in alcohol.

8 Claims, No Drawings

PHOTOSENSITIVE POLYMER COMPOSITIONS COMPRISING POLYETHER-ESTER AMIDES

BACKGROUND OF THE INVENTION (1) Field of the Invention

The present invention relates to a photosensitive polymer composition. More specifically, it relates to a water- or alcohol-developable photosensitive polymer composition having an excellent ink-transfer property and solvent resistance, especially suitable for use in the formation or production of a flexographic printing plate.

(2) Description of the Prior Art

Heretofore, rubber printing plates for flexographic printing have generally been produced as follows. That is, original plates are first prepared by the etching of metal plates. Then, matrixes are prepared from the original plates by heat pressing a thermosetting resin (e.g., a phenol resin) to the original plates and, thereafter, rubber is poured or casted into the matrixes, followed by pressing to form the rubber printing plates. This method, however, has disadvantages in that the skilled operation, high costs and a lot of time are required for preparing the rubber printing plates and also in that the image-reproducibility of the resultant rubber printing plates per se is poor.

In order to eliminate the above-mentioned disadvantages, various attempts have recently been made to directly prepare flexographic printing plates from photosensitive elastomer compositions. That is, the printing plates are prepared from the photosensitive elastomer compositions as follows. A negative or positive image-bearing film having transparent portions is placed closely against a photosensitive layer comprising an elastomer and a photopolymerizable vinyl monomer. The photosensitive layer is then irradiated with activating light through the image-bearing film. Thus, the portions of the photosensitive layer corresponding to the transparent portions of the image-bearing film are photopolymerized. The unpolymerized portions of the photosensitive layer are removed with an appropriate solvent to form the desired relief image.

Various elastomers usable in the formation of photosensitive flexographic printing plates utilizing a photopolymerization reaction have been proposed. For instance, U.S. Pat. Nos. 2,948,611 and 3,024,180 disclose photosensitive polymer compositions suitable for use in flexographic printing comprising polychloroprene rubber or polyurethane rubber and a photopolymerizable monomer having a terminal ethylenically unsaturated bond incorporated therein. U.S. Pat. No. 3,674,486 also discloses a photosensitive polymer system comprising styrene-butadiene rubber or styrene-isobutylene rubber and a photopolymerizable monomer having a terminal unsaturated bond incorporated therein. Furthermore, French Pat. No. 2103825 discloses a photosensitive polymer system containing, as a main polymer, acrylonitrile-butadiene rubber or styrene-isobutylene rubber, and Japanese Examined Patent Publication (Kokoku) No. 52-28044 discloses a photosensitive polymer system containing, as a main polymer, 1,2-polybutadiene.

However, these printing plates have disadvantages in that the rubber elasticity and ink-transfer property thereof are poor as compared with rubber printing plates. Also, the solvent resistance, abrasion resistance, and durability thereof are poor, as compared with the conventional vulcanized rubber printing plate. Furthermore, it is pointed out that the greatest disadvantage of the above-proposed printing plates is that the working atmosphere is remarkably polluted by the use of a halogenated hydrocarbon such as 1,1,1-trichloroethane as a developing solvent in the developing process to dissolve and remove the unpolymerized portions of the printing plate.

SUMMARY OF THE INVENTION

The objects of the present invention are to eliminate the above-mentioned disadvantages of the conventional photosensitive flexographic printing plates and to provide a water- or alcohol-developable photosensitive polymer composition having an excellent ink-transfer property, solvent resistance, abrasion resistance, and durability, useful as a photosensitive layer of a flexographic printing plate.

Other objects and advantages of the present invention will be apparent from the following description.

In accordance with the present invention, there is provided a photosensitive polymer composition comprising:

A. 100 parts by weight of polyether-ester amide comprising (a) at least one compound selected from the group consisting of aminocarboxylic acids having 6 to 15 carbon atoms, lactams having 6 to 15 carbon atoms, and nylon mn salts wherein $10 \leq m+n \leq 30$, (b) at least one poly(alkylene oxide) glycol having a number average molecular weight of 200 to 6000, and (c) at least one dicarboxylic acid having 4 to 20 carbon atoms; and B. 10 to 200 parts by weight of at least one photopolymerizable vinyl monomer having a terminal ethylenically unsaturated bond and having a boiling point of at least 150° C.; and C. 0.01% to 10% by weight, based on the total weight of the composition of a photosensitizer.

DESCRIPTION OF THE PREFERRED EMBODIMENTS

Polyether-ester amides usable as component A in the present invention are composed of components (a), (b), and (c).

Component (a) is a polyamide forming component. Typical examples of such a component are: aminocarboxylic acid having 6 to 15 carbon atoms such as ω-aminocaproic acid, ω-aminoenanthoic acid, ω-aminocaprylic acid, ω-aminopelargonic acid, ω-aminocapric acid, 11-aminoundecanoic acid, and 12-aminododecanoic acid; lactams having 6 to 15 carbon atoms such as caprolactam, enantholactam, laurolactam, and α-(N-dimethylamino)-ε-caprolactam; nylon mn salts wherein $10 \leq m+n \leq 30$ (i.e., equivalent salts of alkylenediamines having m carbon atoms and alkylenedicarboxylic acids having n-2 carbon atoms) such as hexamethylenediamine-adipic acid, dodecamethylenediamine-adipic acid, hexamethylenediamine-azelaic acid, hexamethylenediamine-sebacic acid, and hexamethylenediamine-decanedicarboxylic acid. These components (a) can be used alone or in any mixtures thereof.

In order to increase the flexibility and mechanical properties of polyether-ester amides, other amide forming components such as hexamethylenediamine-isophthalic acid, hexamethylenediamine-terephthalic acid, hexamethylenediamine-cyclohexane-1,4-dicarboxylic acid, and 4,4'-diaminocyclohexylmethane-dodecadioic acid can be used as a minor amount component, i.e., in an amount of 35% by weight or less based on the weight of the component (a).

Furthermore, in order to increase the water-solubility of the polyether-ester amides, the following compounds can be copolymerized as a minor amount polyamide copolymerization component, i.e., in an amount of 30 mole % or less of the total polyamide components. Examples of such compounds are: sulfonates such as sodium-3,5-dicarboxybenzenesulfonate, sodium-3,5-di(aminomethyl)benzenesulfonate, sodium-3,5-di($\beta$-aminoethyl)benzenesulfonate, $\beta$-(sodiumsulfo)adipic acid, and the potassium, tetramethylammonium or trimethylbenzylammonium salts thereof instead of the sodium salts; sulfonate compounds having a triazine ring such as 2,4-diphenoxy-6-[p-(sodiumsulfo)-phenylamino]-s-triazine, 2-hydroxy-4-phenoxy-6-[p-(sodiumsulfo)phenylamino]-s-triazine, 2,4-diphenoxy-6-[$\beta$-(sodiumsulfo)ethylamino]-s-triazine, 2,4-diphenoxy-6-[2',4-di(sodiumsulfo)phenylamino]-s-triazine, and the potassium, tetramethylammonium, or trimethylbenzylammonium salts thereof instead of the sodium salts; the compounds having a piperazine frame such as N,N'bis($\gamma$-aminopropyl)piperazine, N,N'-bis($\beta$-aminoethyl)piperazine, N,N'-bis(carboxylmethyl)piperazine, and N-(aminoethyl)-N'-($\beta$-aminoethyl)-piperazine; and compounds having a quaternary ammonium salt type basic nitrogen atom such as N,N'-bis($\gamma$-aminopropyl)-benzylamine, 6-methyl-6-(N,N-diethylaminomethyl)-4,8-dioxaundecanediamine, and N,N'-dicyclohexly-N,N'-bis(2-carboxypropyl)hexamethylenediamine.

Especially desirable compounds of component (a) are $\omega$-aminocaproic acid, $\omega$-aminododecanoic acid, caprolactam, $\alpha$-(N-dimethylamino)-$\epsilon$-caprolactam, hexamethylenediamine-adipic acid and hexamethylenediamine-sebacic acid because the use of these compounds as component (a) results in polymers having good flexibility and good solubility in water or in alcohol.

The poly(alkylene oxide) glycols of component (b) are those having a polyether segment or segments and forming a polyether-ester by the reaction of the hydroxyl group with carboxyl groups of a dicarboxylic acid of component (c) to form ester linkages. Typical examples of such compounds are polyethylene glycol, poly(1,2-and 1,3-propylene oxide) glycols, poly(tetramethylene oxide)glycol, poly(hexamethylene oxide)-glycol, block or random copolymers of ethylene oxide and propylene oxide, and block or random copolymers of ethylene oxide and tetrahydrofuran. Of these poly(alkylene oxide)glycols, polyethylene glycol is especially desirably used as component (b) of component A in the present invention, since the resultant photosensitive printing plate has the most desirable developability with neutral water or an alcohol.

The number-average molecular weight of the poly(alkylene oxide)glycols used as component (a) in the present invention should be within the range of 200 to 6000. When the molecular weight of component (b) is less than 200, the desired polymer composition cannot be obtained because the melting point of the resultant polymer becomes too low, whereby the processing becomes difficult and the resilience becomes remarkably low. Contrary to this, when the number-average molecular weight of component (b) is more than 6000, the phase separation tends to be generated during the polymerization. Thus, the component (b) having an optimal molecular weight range within the above-mentioned range is selected taking into account, for example, the mechanical properties (e.g., strength, elasticity) of the resultant polymer, the developability of the printing plate formed from the resultant polymer and the durability thereof against ink. The above-mentioned compounds can be used alone or in any mixtures thereof as component (b). The dicarboxylic acid of component (c) has the functions of reacting with the amino group contained in component (a) to form an amide bond and also of reacting with the hydroxyl group contained in component (b) to form an ester bond. Typical examples of component (c) are: aromatic dicarboxylic acids such as terephthalic acid, isophthalic acid, phthalic acid, naphthalene-2,6-dicarboxylic acid, diphenyl-4,4'-dicarboxylic acid, diphenoxyethane dicarboxylic acid, and 5-sodium sulfoisophthalic acid; alicyclic dicarboxylic acids such as 1,4-cyclohexanedicarboxylic acid and dicyclohexyl-4,4'-dicarboxylic acid; and aliphatic dicarboxylic acids such as succinic acid, oxalic acid, adipic acid, sebacic acid and decanedicarboxylic acid. These compounds can be used alone or in any mixture thereof as component (c) in the present invention. The use of adipic acid, sebacic acid, terephthalic acid, isophthalic acid, and 5-sodium sulfoisophthalic acid is desirable because the polymer having the desired flexibility and the desired good solubility in water or in alcohol can be obtained.

The polyether-ester amides of component A of the present invention are obtained from the polymerization of the above-mentioned components (a), (b), and (c). The polymerization of the components (a), (b) and, (c) can be carried out in any known manner. For instance, the following methods can advantageously be used in the preparation of component A:

(1) Components (a) and, (c) are reacted in an equimolar ratio to form a polyamide prepolymer having carboxylic acid groups on both ends of the molecule thereof and, then, component (b) is polymerized therewith in vacuo;

(2) Components (a), (b) and, (c) are charged into a reaction vessel and the mixture is reacted in the presence or absence of water at an elevated temperature and under pressure to form a polyamide prepolymer having carboxylic acid groups on both ends of the molecule thereof, followed by the polymerization thereof under normal or reduced pressure; and (3) Components (a), (b) and (c) are simultaneously charged into a reaction vessel and, after the melt mixing, the mixture is directly polymerized under a high vacuum condition.

The polyether-ester amides thus obtained should desirably have at least a certain polymerization degree in order to obtain sufficient or satisfactory mechanical strengths of the printing plates when the polyether-ester amides are applied, as a main constituent polymer, to photosensitive printing plates. However, the polyether-ester amide having too high a degree of polymerization tends to result in the polymer having a remarkably low solubility in a developing solvent. Accordingly, the relative viscosity ($\eta_r$) of the polyether-ester amide in a 0.5% by weight orthochlorophenol solution at 25° C. is desirably 1.25 to 7.5, more desirably 1.50 to 5.0.

Furthermore, in order to obtain the good flexibility and rubber elasticity desirable for use in a flexographic printing plate, the polymer hardness of the polyether-ester amide is desirably not less than 20 in terms of Shore A but not more than 60 in terms of Shore D, more desirably 30 to 100 in terms of Shore A. The resilience of the polyether-ester amide is desirably 25% to 100%, more desirably 30% to 90%.

As component A, a polyether-ester amide having a terminal unsaturated group(s) which are introduced by reacting the active hydrogen contained in, for example, the carboxyl group(s), amine and hydroxyl group(s) present in the ends of the polyether-ester amide with an epoxy group of an unsaturated epoxy compound such as glycidyl methacrylate can also be used.

The weight ratio of component (a) to components (b) and (c) [i.e., a/(b+c)] in component A is desirably 5/95 to 50/50, more desirably 10/90 to 40/60. This is because the polyether-ester component formed by components (b)+(c) has an important role in producing the desired flexibility and solubility in water or in alcohol.

The compounds usable as component B in the present invention are photopolymerizable vinyl monomers having a terminal ethylenically unsaturated bond and having a boiling point of at least 150° C., and, desirably, having 6 to 40 carbon atoms. Typical examples of such compounds are: photopolymerizable monomers having a hydroxyl group within the molecule thereof and having one terminal ethylenically unsaturated bond such as 2-hydroxyethyl acrylate, 2-hydroxyethyl methacrylate, 2-hydroxypropyl acrylate, 2-hydroxypropyl methacrylate, 3-chloro-2-hydroxypropyl acrylate, 3-chloro-2-hydroxypropyl methacrylate, $\beta$-hydroxyethyl-$\beta$-acryloyloxyethyl phthalate and $\beta$-hydroxyethyl-$\beta$-methacrylethyl phthalate; photopolymerizable monomers having a carboxyl group within the molecule thereof and having one terminal ethylenically unsaturated bond such as acryloyloxyethyl hydrogenphthalate, methacryloyloxyethyl hydrogenphthalate, succinoyloxyethyl acrylate and succinoyloxyethyl methacrylate; photopolymerizable monomers having an amide bond within the molecule thereof and having one terminal ethylenically unsaturated bond such as acrylamide, methacrylamide, N-methylolacrylamide, N-methylolmethacrylamide, diacetone acrylamide, diacetone methacrylamide and methylene bisacrylamide; photopolymerizable monomers obtained from the esterification of poly(alkylene oxide) glycols having 2 to 30 carbon atoms with acrylic or methacrylic acid such as ethylene glycol diacrylate, ethylene glycol dimethacrylate, propylene glycol diacrylate, propylene glycol dimethacrylate; photopolymerizable monomers obtained from the esterification of polyhydric alcohols having 2 to 30 carbon atoms and having 2 to 4 hydroxyl groups with acrylic or methacrylic acid such as 1,4-butanediol diacrylate, 1,4-butanediol dimethacrylate, trimethylolpropane triacrylate, trimethylolpropane trimethacrylate, pentaerythritol triacrylate, pentaerythritol trimethacrylate, pentaerythritol tetraacrylate, pentaerythritol tetramethacrylate, glycerol diacrylate, glycerol dimethacrylate, glycerol triacrylate and glycerol trimethacrylate; photopolymerizable monomers having 2 to 5 ethylenically unsaturated bonds obtained from the addition reaction of acrylic or methacrylic acid to the glycidyl ethers of polyhydric alcohols having 2 to 5 hydroxyl groups such as ethylene glycol diglycidyl ether and propylene glycol diglycidyl ether; photopolymerizable monomers having 2 to 5 ethylenically unsaturated bonds obtained from the reaction of glycidyl acrylate or glycidyl methacrylate with compounds having an active hydrogen such as unsaturated carboxylic acids having 2 to 30 carbon atoms, saturated polyhydric carboxylic acids having 2 to 30 carbon atoms and having 2 to 5 hydroxyl groups, unsaturated alcohols having 2 to 30 carbon atoms, saturated polyhydric alcohols having 2 to 30 carbon atoms and 2 to 5 hydroxyl groups and primary or secondary amines having 2 to 30 carbons atoms; and photopolymerizable monomers having a triazine ring such as triacrylformal. These compounds can be used alone or in any mixture thereof as component B.

The use of $\beta$-hydroxyethyl-$\beta$-acryloyloxyethyl phthalate, methacryloyloxyethyl hydrogenphthalate, succinoyloxyethyl acrylate, ethyleneglycol diacrylate, propyleneglycol diacrylate, glycerol diacrylate, glycerol dimethacrylate, pentaerthritol triacrylate, the addition reaction product of ethylene glycol diglycidyl ether acrylic acid, the addition reaction product of propylene glycol diglycidyl ether and acrylic acid, the addition reaction product of xylenediamine and glycidyl methacrylate, and triacrylformal as component B is especially desirable because these compounds have excellent compatibility with component A and good photopolymerizability.

The boiling point of the photopolymerizable vinyl monomers of component B should be at least 150° C. If the boiling point of component B is less than 150° C., satisfactory image-reproducibility tends to be unobtainable, since most portions of the component B are vaporized or pass out of the printing plate during the formation of the printing plate, and the image-reproducibility decreases with the lapse of time due to the continuation of the passing of component B from the printing plate after the formation of the printing plate. The upper limit of the boiling point of component B cannot be specifically defined, since there are compounds having no substantial boiling point near 300° C. due to the occurrence of thermal degradation of the molecules.

Component B should be used in an amount of 10 to 200 parts by weight, based on 100 parts by weight of the polyether-ester amide. The use of component B in an amount of less than 10 parts by weight results in the formation of a structure having too low a density after photopolymerization, whereby good image reproducibility cannot be obtained. Contrary to this, the use of component B in an amount of more than 200 parts by weight results in the formation of an extra-dense crosslinked structure after photopolymerization, whereby remarkable problems occur, namely, the image portion becomes brittle and undesirable cracks are generated. Accordingly, the amount of component B used in the present composition should be 10 to 200 parts by weight, desirably 20 to 150 parts by weight, based on 100 parts by weight of component A.

In order to improve the moldability during the formation of the printing plate from the present composition and the flexibility of photopolymerized portions, an appropriate plasticizer can be incorporated into the present composition. The plasticizers usable in the present invention should have good compatibility with the polyether-ester amide of component A. Typical examples of such plasticizers are: polyhydric alcohols having 2 to 5 hydroxyl groups such as ethylene glycol, diethylene glycol, triethylene glycol and trimethylolpropane; and compounds having a sulfonamide group such as toluenesulfonamide, N-ethyltoluenesulfonamide and N-butylbenzenesulfonamide. These compounds can be used alone or in any mixture thereof. Generally speaking, the use of too much plasticizer tends to cause a decrease in the crosslinking density of the photopolymerized portions, thereby rapidly decreasing the image-reproducibility. However, when the polymer having an unsaturated bond obtained by reacting the terminal group(s) of the polyether-ester amide with, for example, glycydyl methacrylate is used, the decrease in the image-reproducibility is small.

Photosensitizers usable for rapidly effecting the photopolymerization reaction of the present composition may be any conventional compounds. Examples of such compounds are benzoin type compounds, benzoin alkyl ether type compounds, benzophenone type compounds, anthraquinone type compounds, benzyl type compounds, acetophenone type compounds, and diacetyl type compounds. These photosensitizers are generally used in an amount of 0.01% to 10% by weight based on the total weight of the composition.

In order to increase the thermal stability of the present composition, any conventional thermal polymerization inhibitor can be used. Examples of the desirable thermal polymerization inhibitors are phenolic compounds, hydroquinone type compounds, and catechol type compounds. In order to improve the heat resistance of the present composition, phosphorous compounds such as triphenylphosphine, and L-ascorbic acid can be added to the present composition. Furthermore, various conventional additives such as dyestuffs, pigments, oxidation inhibitors, ultraviolet light absorbents, surfactants, and defoaming agents can be used in the present composition.

The present photosensitive polymer composition obtained as mentioned above can be used in the formation of various printing plates. For instance, a flexographic printing plate can be prepared from the present photosensitive polymer composition as follows:

The present photosensitive polymer composition is melted at a temperature of about 60° C. to about 140° C. and, then, the composition in the molten state is extrusion molded at a predetermined thickness onto a support. Alternatively, the present photosensitive polymer composition is dissolved in a suitable solvent to form a polymer solution and, then, the resultant solution is casted at a predetermined thickness on a support, followed by drying and removing the solvent from the coated layer (i.e., a dry molding method). Furthermore, the solvent is distilled off from the photosensitive polymer solution and, then, the resultant composition is pelletized. The pelletized particles are deposited on a support by means of a press under heating and pressurizing conditions to form the photosensitive layer. Furthermore, an adhesive layer or a primer layer can be inserted between a support and a photosensitive polymer composition layer.

Supports usable in the production of the photosensitive layer are: for example, metal plates or sheets made from metals such as iron, stainless steel, aluminum, and copper; synthetic resin sheets such as polyester film; and synthetic rubber sheets such as styrene-butadiene rubber sheets. In the case of the metal plates or sheets, the surfaces thereof may be subjected to, for example, formation treatments such as phosphating and chromating; galvanizing treatments such as chrome galvanizing and zinc galvanizing; and physical treatments such as sand blast treatment.

The thickness of the photosensitive layer is desirably 0.1 to 10 mm. In the case of the flexographic printing plates, the total thickness of the printing plates is generally 1.5 mm or more. In this case, the photosensitive printing plates can be composed of a multi-layer structure. This structure can be prepared by, for example, first forming a photosensitive layer on the support, then exposing, the entire surface thereof to effect the photopolymerization and, thereafter, forming a photosensitive layer on the photopolymerized layer to afford the final thickness.

The relief images for printing can be formed from the photosensitive printing plate prepared as mentioned above by placing a negative or positive image-bearing transparency closely against the photosensitive layer and, then, irradiating the photosensitive layer with ultraviolet light, mainly having a wavelength of 300 to 400 nm (or $\mu$m) to effect insolubilization of the irradiated portions by photopolymerization. Thereafter, the unpolymerized portions of the photosensitive layer are dissolved by a suitable developing solvent such as water or an alcohol in a brush-type developing apparatus or a spray-type developing apparatus to form a relief image on the support.

The flexographic printing plates obtained from the present photosensitive polymer compositions have the following advantages over the conventional photosensitive flexographic printing plates.

First, since the polyether-ester amides used as component A are elastomers having a block structure containing the polyamide as a hard segment and the polyether-ester as a soft segment, both good flexibility and rubber elasticity can be obtained. Especially, since the polyether-ester amides have an excellent bending fatigue resistance as compared with nonvulcanized synthetic rubbers used in the conventional photosensitive flexographic printing plates, troubles such as the generation of cracks in the relief during printing do not occur. In addition, since the polyether-ester amides have an extremely excellent oil resistance, oil ink and UV cure type ink containing ethylacetate, which cannot be used in the conventional photosensitive flexographic printing plate, can be used in the flexographic printing plate obtained from the present photosensitive polymer composition. Furthermore, since the polyether-ester amide component contains the copolymerized poly(alkylene oxide) unit, the polyether-ester amide component can be soluble in water or in alcohol by appropriately selecting the composition of the polymer. Therefore, solvents such as water, a mixed solvent of water and an alcohol, and an alcohol, which are environmentally acceptable in the working place, can be used as a developing solvent. This is extremely advantageous as compared with the conventional photosensitive flexographic printing plate system in which developing solvents such as halogenated hydrocarbons causing remarkable pollution in the working environment have to be used.

The photosensitive composition of the present invention can be most effectively used in a flexographic printing plate, but can also be used in, for example, a relief image printing plate other than a flexographic printing plate, a gravure printing plate, a lithographic printing plate and a photoresist.

EXAMPLES

The present invention will now be further illustrated by, but is by no means limited to, the following examples, in which all parts, percentages, and ratios are by weight unless otherwise indicated.

EXAMPLE 1

10.6 parts of $\epsilon$-Caprolactam, 11.6 parts of the salt of hexamethylene and adipic acid (m=6 and n=6), 67.6 parts of polyethylene glycol (PEG 600) having a number-average molecular weight of 600 and 16.5 parts of adipic acid were reacted in the presence of 0.05 parts of tetrabutyl titanate at a temperature of 250° C. under a reduced pressure for 6 hours to form viscous molten polymer. The resultant polymer was discharged onto a stainless steel belt to obtain strands.

The polyether-ester amide thus obtained was found to be a block copolymer having the following composition as a result of a composition analysis.

| Nylon 6 | 10 |
|---|---|
| Nylon 66 | 10 |
| PEG 600.Adipate | 80 |

The relative viscosity of this polymer was 1.65 as measured in a 0.5% orthochlorophenol solution at 25° C., the hardness thereof was a Shore A of 70 (a Shore D of 25), and the resilience thereof was 75%. This polymer was soluble in water.

One hundred parts of the polyether-ester amide elastomer obtained above was dissolved in 60 parts of a mixed solvent of ethanol/water (70/30) at a temperature of 80° C. Then, 2 parts of glycidyl methacrylate were added to the above-prepared solution and the mixture was reacted at a temperature of 80° C. for 1 hour to effect the reaction of the end groups of the polymer with the glycidyl methacrylate. As a result of the quantitative determination of the end groups of the resultant polymer, it was confirmed that the terminal unsaturated groups were introduced into the ends of the polymer.

To the polymer solution obtained above, 90 parts of β-hydroxy-β'-acryloyloxyethyl phthalate and 5 parts of propylene glycol diacrylate as a photopolymerizable monomer, 3 parts of dimethylbenzyl ketal as a photosensitizer and 0.1 part of hydroquinone monomethyl ether as a thermal stabilizer were added and thoroughly mixed and dissolved at a temperature of 80° C. for 1 hour, while stirring.

The photosensitive polymer composition solution thus obtained was cast on a polyester film support having a thickness of 150 μm (micrometer) and having the previously coated polyester type adhesive layer in such a manner that the thickness after drying was 2650 μm. Then, the coated support was placed in an oven at a temperature of 60° C. for 10 hours, whereby the solvent was completely removed therefrom. Thus, a flexographic printing plate having a total thickness, including the support, of 2800 μm was obtained.

On the surface of the photosensitive layer, gray scale negative film (21 steps sensitivity guide manufactured by Stouffer Co., Ltd.), and image-reproducibility evaluation negative film (including 150 lines; 3%, 5%, and 10% half-tone; independent dots having 200 μm and 300 μm diameters; fine lines having 50 μm and 70 μm widths) were placed closely under vacuum against the photosensitive layer and the photosensitive layer was exposed for 7 minutes to a chemical lamp.

After the exposure, the printing plate was developed in a brush-type developing apparatus containing neutral water at a liquid temperature of 30° C. Thus, a relief image having a depth of 700 μm was formed for a developing time of 2 minutes.

As a result of the evaluation of the relief image thus obtained, up to 16 steps remained in the gray scale portions, which indicated the high sensitivity of the printing plate. Furthermore, it was confirmed that fine portions such as the 3% half-tone, 200 μm independent dot, and 50 μm fine line were completely reproduced in the image portions. The hardness of the printing plate was a Shore A of 60, which indicated the desired level of flexibility suitable for use in a flexographic printing.

The flexographic printing plate thus obtained was used in a printing test. As a result, prints having a good ink transfer property and having sharp finish as a flexographic printing were obtained.

EXAMPLE 2

23.2 parts of the salt of hexamethylene diamine and adipic acid (m=6, n=6), 61.2 parts of polyethylene glycol (PEG 400) having a number-average molecular weight of 400, 20.5 parts of adipic acid and 4.2 parts of sodium sulfoisophthalic acid were polymerized in the same manner as described in Example 1. Thus, polyether-ester amide having the following composition was obtained.

| Nylon 66 | 20 |
|---|---|
| PEG 400.Adipate | 70 |
| PEG 400.Sodium sulfoisophthalate | 10 |

The relative viscosity of this polymer was 2.20, the hardness was a Shore A of 65 (a Shore D of 20) and the resilience was 65%.

One hundred parts of the polymer obtained above were dissolved in 100 parts of a mixed solvent of ethanol/water (60/40) at a temperature of 80° C. Then, 4 parts of glycidyl methacrylate were added to the solution and the mixture was reacted at a temperature of 80° C. for 2 hours to effect the inclusion of unsaturate groups on the ends of the polymer.

To the polymer solution thus obtained, 60 parts of the photopolymerizable monomer having the following structure, obtained from the addition reaction of 1 mole of propylene glycol diglycidyl ether and 2 moles of acrylic acid were added:

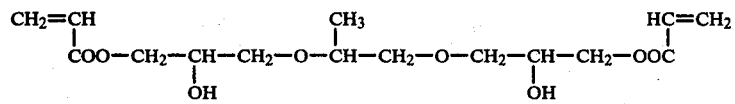

Then, 2 parts of benzoin methyl ether as a photosensitizer, 2 parts of triphenylphosphine and 0.1 part of t-butylcathecol as a thermal stabilizer, and 34 parts of N-butylbenzenesulfonamide as a plasticizer were added and thoroughly mixed and dissolved at a temperature of 80° C. for 1 hour, while stirring.

The photosensitive polymer composition solution thus obtained was cast on a polyester film having a thickness of 200 μm and having a previously coated polyester type adhesive layer in such a manner that the thickness after drying was 2000 μm. Then, the coated film was dried in an oven at a temperature of 60° C. for 12 hours, whereby the solvent was completely removed therefrom. Then, the photosensitive plate thus obtained was entirely exposed for 2 minutes to a high pressure mercury lamp to effect the photocuring.

Then, on the photocured photosensitive layer, the photosensitive polymer composition solution obtained above was again cast in such a manner that the thickness after drying was 800 μm. The coated film was dried in an oven at a temperature of 60° C. for 5 hours to remove the solvent therefrom. Thus, a flexographic printing plate having a laminated structure containing the underlying photocured layer and having the total thickness of 3000 μm was obtained.

On the surface of the photosensitive layer of the printing plate thus obtained, the same negative film for evaluating the image used in Example 1 was placed closely under vacuum against the photosensitive layer and the photosensitive layer was exposed for 1 minute by a chemical lamp.

After the exposure, the printing plate was developed in a brush-type developing apparatus containing neutral water at a liquid temperature of 35° C. Thus, a relief image having a depth of 800 μm was obtained in a developing time of about 3 minutes.

As a result of the evaluation of the relief image thus obtained, it was confirmed that fine portions such as the 3% half-tone, 200 μm independent dot, and 50 μm fine line were completely reproduced in the image portions. The hardness of the printing plate was a Shore A of 50, which indicated a satisfactory property suitable for use as a flexographic printing plate.

EXAMPLE 3

49.1 parts of ω-aminododecanoic acid, 48.7 parts of poly(tetramethylene oxide) glycol (PTMG 1000) having a number-average molecular weight of 974, and 8.1 parts of terephthalic acid were polymerized in the same manner as in Example 1. Thus, a polyether-ester amide having the following composition was obtained.

| | |
|---|---|
| Nylon 12 | 45 |
| PTMG 974.Telephthalic acid | 55 |

The relative viscosity of this polymer was 3.10, the hardness was a Shore D of 40 (a Shore A of 90), and the resilience was 61.

One hundred parts of the polymer obtained above were dissolved in 100 parts of ethanol at a temperature of 80° C. Then, 50 parts of glycerol dimethacrylate and 5 parts of triacrylformal as a photopolymerizable monomer, 5 parts of benzophenone as a photosensitizer and 2 parts of triphenylphosphine as a thermal stabilizer were added and thoroughly mixed at a temperature of 80° C. for 1 hour, while stirring.

The photosensitive polymer composition solution obtained above was cast on a steel support having a thickness of 250 μm and having a previously coated epoxy type adhesive layer in such a manner that the thickness after drying was 480 μm. Then, the coated film was dried in an oven at a temperature of 60° C. for 3 hours, whereby the solvent was completely removed therefrom. Thus, the printing plate having a total thickness of 730 μm and having a backed steel support was obtained.

The photosensitive layer was exposed for 2 minutes by a high pressure mercury lamp by using the same negative film as used in Example 1. After the exposure, the printing plate was developed for 5 minutes in a brush-type developing apparatus containing ethanol at a liquid temperature of 35° C.

As a result of the evaluation of the relief image thus obtained, up to 16 steps remained in the gray scale portions, indicating a high printing plate sensitivity. Furthermore, it was confirmed that the 3% half-tone, 200 μm independent dot and 50 μm fine line were satisfactorily reproduced in the image portions. The hardness of the printing plate was a Shore A of more than 100 and a Shore D of 60, which indicated that this printing plate was desirably used as an ordinary relief image printing plate.

We claim:
1. A photosensitive polymer composition comprising:
    a. 100 parts by weight of polyether-ester amide comprising (a) at least one compound selected from the group consisting of aminocarboxylic acids having 6 to 15 carbon atoms, lactams having 6 to 15 carbon atoms and nylon mn salts wherein $10 \leq m+n \leq 30$, (b) at least one poly(alkylene oxide) glycol having a number average molecular weight of 200 to 6000, and (c) at least one dicarboxylic acid having 4 to 20 carbon atoms;
    b. 10 to 200 parts by weight of at least one photopolymerizable vinyl monomer having a terminal ethylenically unsaturated bond and having a boiling point of at least 150° C.; and
    c. 0.01% to 10% by weight, based on the total weight of the composition, of a photosensitizer.

2. A composition as claimed in claim 1, wherein the poly(alkylene oxide) glycol component (a) of component A is polyethylene glycol.

3. A composition as claimed in claim 1, wherein the relative viscosity of the polyether-ester amide of component A in a 0.5% by weight orthochlorophenol solution at 25° C. is 1.25 to 7.5.

4. A composition as claimed in claim 1, wherein the hardness of the polyether-ester amide of component A is not less than 20 in terms of Shore A but not more than 60 in terms of Shore D.

5. A composition as claimed in claim 1, wherein the resilience of the polyether-ester amide of component A is 25% to 100%.

6. A composition as claimed in claim 1, wherein a weight ratio of component (a) to components (b) and (c) in component A is 5/95 to 50/50.

7. A composition as claimed in claim 1, wherein component A is a polyether-ester amide soluble in an alcohol or water.

8. A composition as claimed in claim 1, wherein the amount of component B is 20 to 150 parts by weight based on 100 parts by weight of component A.

* * * * *